US011852661B2

United States Patent
Fan et al.

(10) Patent No.: US 11,852,661 B2
(45) Date of Patent: Dec. 26, 2023

(54) METHOD AND SYSTEM FOR EXTRACTING CHARACTERISTIC SIGNAL FROM POWER FREQUENCY SIGNAL AND FILE MANAGEMENT METHOD THEREFOR

(71) Applicant: WILLFAR INFORMATION TECHNOLOGY CO., LTD., Hunan (CN)

(72) Inventors: Lv Fan, Hunan (CN); Wujuan Zhang, Hunan (CN); Feng Tian, Hunan (CN); Jun Li, Hunan (CN); Jun Li, Hunan (CN); Zhengquan Xie, Hunan (CN)

(73) Assignee: WILLFAR INFORMATION TECHNOLOGY CO., LTD., Hunan (CN)

( * ) Notice: Subject to any disclaimer, the term of this patent is extended or adjusted under 35 U.S.C. 154(b) by 98 days.

(21) Appl. No.: 17/914,748

(22) PCT Filed: Sep. 4, 2020

(86) PCT No.: PCT/CN2020/113501
§ 371 (c)(1),
(2) Date: Sep. 26, 2022

(87) PCT Pub. No.: WO2021/189774
PCT Pub. Date: Sep. 30, 2021

(65) Prior Publication Data
US 2023/0117844 A1 Apr. 20, 2023

(30) Foreign Application Priority Data
Mar. 27, 2020 (CN) .......................... 202010228563.1

(51) Int. Cl.
*G01R 19/00* (2006.01)
*G01R 19/175* (2006.01)
(Continued)

(52) U.S. Cl.
CPC ..... *G01R 19/175* (2013.01); *G01R 19/16528* (2013.01); *H04B 3/54* (2013.01)

(58) Field of Classification Search
CPC ............ G01R 19/175; G01R 19/16528; G01R 19/2509; G01R 19/2513; H04B 3/54
See application file for complete search history.

(56) References Cited

U.S. PATENT DOCUMENTS 3,187,273 A * 6/1965 Chasek ...................... H04J 3/00
327/78
2008/0258882 A1* 10/2008 Lester .................. H04B 14/026
375/259

(Continued)

FOREIGN PATENT DOCUMENTS

| CN | 101251951 A | 8/2008 |
|----|-------------|--------|
| CN | 101884162 A | 11/2010 |

(Continued)

OTHER PUBLICATIONS

Zhou et al. "Feature Extraction and Fuzzy Classification Method for Two-way Power Frequency Communication Signals" Power System Technology, 1999(07):41-51, ISSN: 1000-3673.

*Primary Examiner* — Thang X Le

(57) ABSTRACT

A method for extracting a characteristic signal from a power frequency signal includes steps of: S1, detecting a voltage half-wave zero-crossing area in a single voltage cycle in the power frequency signal by a signal; superimposing a voltage modulation signal on the voltage half-wave zero-crossing area, and superimposing an instantaneous pulse on a current cycle in the power frequency signal corresponding to the voltage half-wave zero-crossing area; generating the characteristic signal with current cycles and voltage cycles; S2, demodulating whether there is the voltage modulation signal in the power frequency signal, if so, executing step S3; and S3, demodulating the characteristic signal to obtain the (Continued)

current modulation signal and the voltage modulation signal respectively; and determining whether data corresponding to the current modulation signal and date corresponding to the voltage modulation signal are predetermined data, wherein if so, the characteristic signal exists. The method has strong anti-interference ability.

10 Claims, 1 Drawing Sheet

(51) Int. Cl.
*H04B 3/54* (2006.01)
*G01R 19/165* (2006.01)

(56) References Cited

U.S. PATENT DOCUMENTS

| | | | | |
|---|---|---|---|---|
| 2019/0363530 | A1* | 11/2019 | Jakupi | H02H 1/0015 |
| 2022/0113338 | A1* | 4/2022 | Li | G01R 19/175 |

FOREIGN PATENT DOCUMENTS

| | | | |
|---|---|---|---|
| CN | 104917547 | A | 11/2010 |
| CN | 102025194 | A | 4/2011 |
| CN | 105281284 | A | 1/2016 |
| CN | 105703652 | A | 6/2016 |
| CN | 207833689 | U | 9/2018 |
| CN | 111487456 | A | 8/2020 |
| JP | 2015155656 | A | 8/2015 |

* cited by examiner

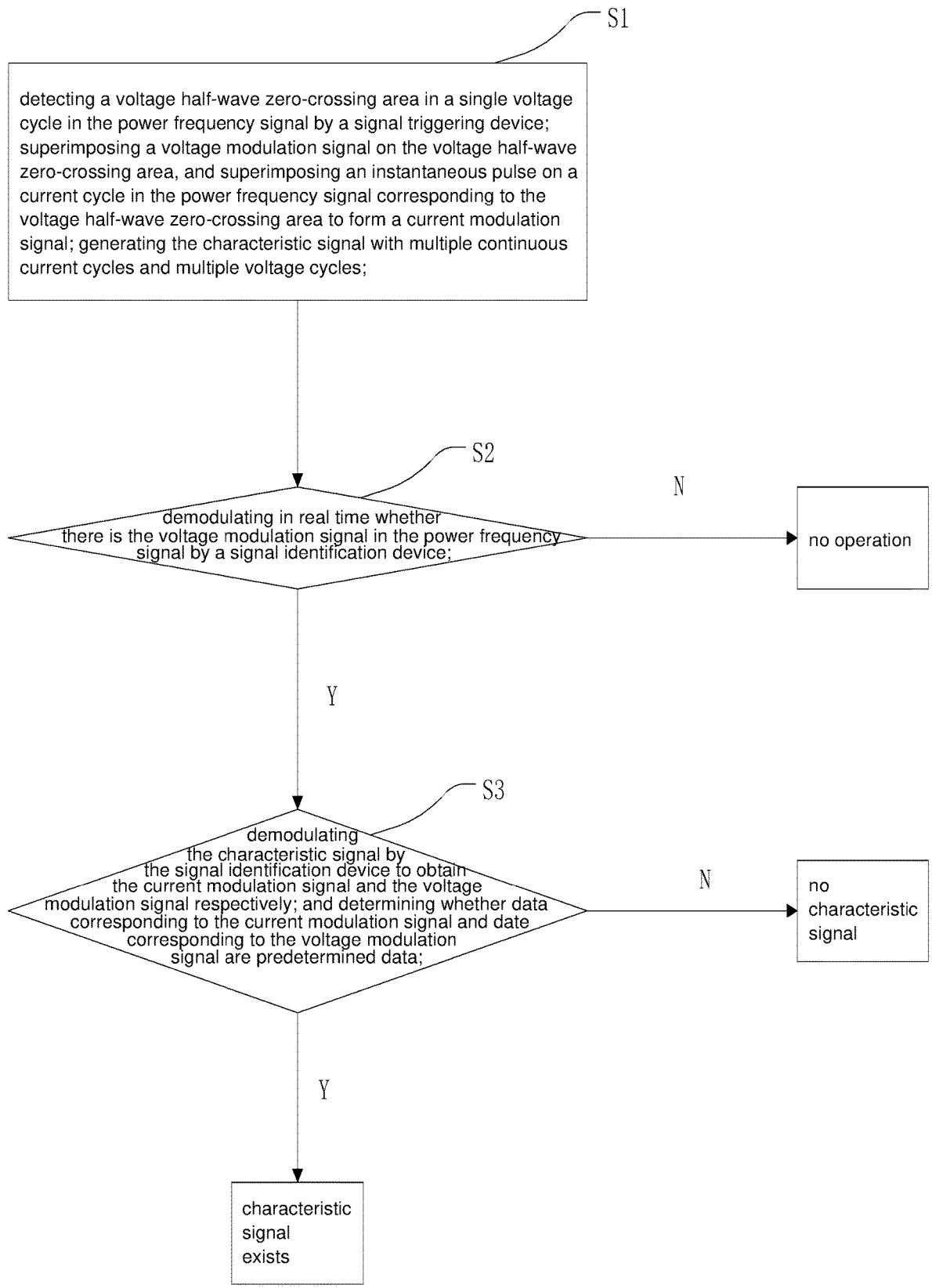

METHOD AND SYSTEM FOR EXTRACTING CHARACTERISTIC SIGNAL FROM POWER FREQUENCY SIGNAL AND FILE MANAGEMENT METHOD THEREFOR

BACKGROUND OF THE PRESENT INVENTION

Field of Invention

The present invention relates to power communication systems, and more particularly to a method and a system for extracting a characteristic signal from a power frequency signal, and a file management method therefor.

Description of Related Arts

The household line relationship files of a court are the basic elements for smart grid construction. Accurate household line relationships of a court are fundamental for refined management of power companies. However, for some courts, the household line relationship files are not undated timely or recorded correctly due to temporary changes of lines. As a result, abnormal situations such as negative line loss and high line loss will occur during the assessment of the court. In addition, the phase sequence relationship between low-voltage user equipment and branch lines is unclear, which leads to problems such as difficulty in maintenance positioning after power failure.

Commercially available devices for accurately identifying the household line relationships are divided into two types: non-intrusive identification and intrusive identification. The former mainly includes analysis based on big data, while the latter mainly includes carrier technology, pulse current technology, etc. Intrusive identification has obvious advantages over non-intrusive identification in terms of identification speed, wherein the identification of a typical court can be finished in minutes, while the non-intrusive identification is difficult to achieve 100% identification rate when the load is complex. A difficulty of intrusive identification lies in which algorithm should be used to demodulate the intrusive signal, which can lead to the presence and absence of the signal.

Identification of the power frequency current characteristic signal based on the pulse current method has been disclosed in some patents, which uses the voltage characteristic signal generated by the modulated current for identification. Such single criterion has poor anti-interference ability and is difficult to apply in the industrial distribution network with severe noise interference. For the typical court and occasions with large harmonics, the selection of the characteristic threshold is very sensitive. If there is a misjudgment, it will mislead the judgment of the household line change relationship of the court.

Chinese patent ZL201810565782.1 disclosed a method and a device for identifying power frequency pulse current loop carrier across courts, which can be applied to carrier meter. The method includes: receiving a power frequency pulse current loop carrier signal sent by a concentrator at a master node; judging whether the power frequency pulse current loop carrier signal is synchronized with a court fingerprint identification signal, wherein the court fingerprint identification signal is a standard court signal corresponding to the carrier meter; if the power frequency pulse current loop carrier signal is synchronized with the court fingerprint identification signal, it is determined that the carrier meter and a corresponding concentrator belong to the same court; and if the power frequency pulse current loop carrier signal is not synchronized with the court fingerprint identification signal, it is determined that the carrier meter and the corresponding concentrator belong to different courts. Such method can identify meter data to a certain extent, but it cannot solve the above-mentioned problems.

Therefore, the conventional household line relationship file information detection is still defective and needs to be improved.

SUMMARY OF THE PRESENT INVENTION

In view of the above-mentioned deficiencies of the prior art, an object of the present invention is to provide a method and a system for extracting a characteristic signal from a power frequency signal, and a file management method therefor, which can improve extraction speed and stability of the characteristic signal in the power frequency signal, so as to prevent misjudgments, thereby accurately determining a topological relationship of electronic equipment in the line.

Accordingly, in order to accomplish the above objects, the present invention provides:

a method for extracting a characteristic signal from a power frequency signal, comprising steps of:

S1, detecting a voltage half-wave zero-crossing area in a single voltage cycle in the power frequency signal by a signal triggering device; superimposing a voltage modulation signal on the voltage half-wave zero-crossing area, and superimposing an instantaneous pulse on a current cycle in the power frequency signal corresponding to the voltage half-wave zero-crossing area to form a current modulation signal; generating the characteristic signal with multiple continuous current cycles and multiple voltage cycles;

S2, demodulating in real time whether there is the voltage modulation signal in the power frequency signal by a signal identification device, if so, executing step S3; if not, performing no operation; and S3, demodulating the characteristic signal by the signal identification device to obtain the current modulation signal and the voltage modulation signal respectively; and determining whether data corresponding to the current modulation signal and date corresponding to the voltage modulation signal are predetermined data, wherein if so, the characteristic signal exists; if not, no characteristic signal exists.

Preferably, in the above method, each of the multiple voltage cycles forms the voltage modulation signal; N instantaneous pulses form the current modulation signal.

Preferably, in the above method, a demodulating process in the step S3 comprises steps of:

S31, evenly dividing the multiple current cycles into successive current cycle groups, and evenly dividing the multiple voltage cycles into successive voltage cycle groups; wherein each of the current cycle groups comprises continuous N current cycles, and each of the voltage cycle groups comprises continuous N voltage cycles;

S32, matching the voltage cycle groups with the current cycle groups before participating in calculation;

S33, performing Gaussian differential variance demodulation on the N voltage cycles in each of the voltage cycle groups to obtain N voltage modulation signals for synthesizing a partial voltage characteristic signal, and determining whether the partial voltage characteristic signal is a predetermined voltage signal; if so, executing step S34; if not, executing the step S2 because no characteristic signal exists;

S34, performing time domain difference matrix algorithm processing on the N current cycles in each of the current cycle groups to obtain the current modulation signal, and determining whether the current modulation signal is a predetermined current signal; if so, executing step S35; if not, executing the step S2 because no characteristic signal exists; and S35, determining whether calculations of all the voltage cycle groups are completed; if so, determining the characteristic signal exists; if not, executing the step S32.

Preferably, in the above method, in the step S33, the Gaussian differential variance demodulation comprises steps of:

S331, performing multiple sliding variance calculations on a voltage zero-crossing area by the signal identification device to obtain multiple sliding variance values, and selecting an optimal value according to a Gaussian distribution as a voltage value identification variance; and S332, determining whether the voltage value identification variance is larger than an identification threshold by the signal identification device; wherein if so, existence of the voltage modulation signal is confirmed; if not, no voltage modulation signal exists.

Preferably, in the above method, the sliding variance calculations comprise: changing an initial voltage sampling point several times in the voltage zero-crossing point area, and obtaining same numbers of voltage sampling points each time; performing differential calculation on two adjacent voltage sampling points respectively to obtain multiple voltage differential point values, and then calculating with a sliding variance calculation formula:

$$s_k = \frac{1}{K} \sum_{j=k}^{K+k} [\Delta U_j - \Delta U_{MK}]^2;$$

wherein K is a quantity of the voltage sampling points, which means a quantity of the voltage differential point values; $\Delta U_j$ (j=k, k+1, ..., K+k) represents the voltage differential point values; $\Delta U_{MK}$ is an average value of the K voltage differential point values; and k is a position of the initial voltage sampling point after sliding.

Preferably, in the above method, the step S34 comprises specific steps of:

S341, determining the N current cycles and a reference current cycle participating in calculation;

S342, performing the time domain difference matrix algorithm processing on two current half-waves of each of the current cycles and two reference current half-waves of the reference current cycle, respectively, to obtain a differential half-wave matrix, and then obtaining the characteristic peak value;

S343, comparing the characteristic peak value with modulation intensity of the current cycles; if an absolute value of the characteristic peak value is greater than or equal to twice the modulation intensity, determining the current modulation signal exists, and executing step S344; if not, executing the step S2 because no characteristic signal exists; and S344, determining whether the current modulation signal is the predetermined current signal, if so, executing the step S35; if not, executing the step S2.

Preferably, in the above method, the time domain difference matrix algorithm formula is:

$$\Delta I_n = \sum_{a=1}^{A}(i_{na} - i_{f(n)a});$$

wherein n=1, 2, ..., 2N is a serial number of differential half-waves; A is a total number of current sampling points on one of the current half-waves; $i_{na}$ is a current sampling point of the current half-waves participating in calculation; $i_{f(n)a}$ is a current sampling point of the reference current half-waves; and f(n) is a serial number of the reference current half-waves;

$$R = \sum_{n=1}^{2N}(\Delta I_n * M_n);$$

wherein R is the characteristic peak value; $\Delta I_n$ represents a number n differential half-wave; $M_n$ is a matrix variable of the number n differential half-wave.

Preferably, in the above method, the step S2 comprises specific steps of:

S21. acquiring the voltage cycles to be detected and several previous continuous voltage cycles by the signal identification device; performing differential calculation on voltage sampling points near zero-crossing points of two adjacent voltage cycles, so as to obtain several differential voltage values;

S22, performing variance calculation on the differential voltage values to obtain a voltage value variance; and S23; determining whether the voltage value variance exceeds a preset threshold by the signal identification device, wherein if so, a voltage characteristic point exists; if not, no voltage characteristic point exists.

Preferably, in the above method, a calculation formula of the voltage value variance is:

$$s^2 = \frac{1}{N} \sum_{i=1}^{N}[\Delta U_i - \Delta U_M]^2;$$

wherein $\Delta U_i$ (i=1, 2, ..., N) represents the differential voltage values; $\Delta U_M$ is an average value of all the differential pressure values involved in calculation; and N is a quantity of the differential pressure values.

A system for extracting a characteristic signal from a power frequency signal is also provided, comprising: a signal identification device and multiple signal triggering devices; wherein the system executes the method for extracting the characteristic signal from the power frequency signal as mentioned above.

A file management method for household line relationships in a court is also provided, comprising: adopting the method for extracting the characteristic signal from the power frequency signal as mentioned above, and then performing file management on the household line relationships.

Compared with the prior art, the method and the system for extracting the characteristic signal from the power frequency signal, and the file management method therefor provided by the present invention require small calculation amount and calculation speed is high, which are capable of real-time online monitoring. Furthermore, the present invention has strong anti-interference ability and high signal demodulation accuracy, which is suitable for industrial distribution networks with large interference.

BRIEF DESCRIPTION OF THE DRAWINGS

FIGURE is a flow chart of a method for extracting a characteristic signal from a power frequency signal according to the present invention.

DETAILED DESCRIPTION OF THE PREFERRED EMBODIMENT

In order to make the objects, technical solutions and effects clearer, the present invention will be further described below with reference to the accompanying drawings and embodiment. It should be understood that the preferred embodiment described herein is exemplary only and is not intended to be limiting.

Referring to FIG. 1, the present invention provides a method for extracting a characteristic signal from a power frequency signal, comprising steps of:

S1, detecting a voltage half-wave zero-crossing area in a single voltage cycle in the power frequency signal by a signal triggering device; superimposing a voltage modulation signal on the voltage half-wave zero-crossing area, and superimposing an instantaneous pulse on a current cycle in the power frequency signal corresponding to the voltage half-wave zero-crossing area to form a current modulation signal; generating the characteristic signal with multiple continuous current cycles and multiple voltage cycles; preferably, according to basic properties of the voltage cycles and the current cycles, each voltage cycle of the present invention forms one voltage modulation signal; of course, it can also be other forms, for example, multiple voltage cycles form one voltage modulation signal, which is not specifically limited in the present invention; similarly, the current modulation signal is formed by N current cycles, and N is no less than 1; specifically, in general, the current modulation signal is an instantaneous pulse, which appears in a form of distorted current and is superimposed on the current cycle of the normal power frequency signal; expression of the voltage modulation signal is a voltage sag on a normal voltage cycle of the power frequency signal; the power frequency signal is a common one in the field, which is generally a 50 Hz alternating current, or with other frequencies; however, the signal triggering device and the signal identification device need to be adjusted before use, and specific adjustment method is well-known in the field and will not be limited in the present invention; before the step S1, the signal triggering device can be used to detect frequency and amplitude of the power frequency signal, wherein if a predetermined frequency or a predetermined amplitude is exceeded, then a warning message is sent out for notifying staffs to adjust the power frequency signal or to adapt and adjust the signal triggering device; after corresponding problems are eliminated, the step S1 can be performed;

S2, demodulating in real time whether there is the voltage modulation signal in the power frequency signal by a signal identification device, if so, executing step S3; if not, performing no operation; wherein it should be noted that voltage modulation signal detection in the step S2 is a preliminary detection, which preferably adopts differential variance calculation; specifically, the differential variance calculation is performed between the voltage cycle to be detected and the previous several voltage cycles, and the present invention will not limit specific calculation processes; because the voltage modulation signal is expressed as the voltage sag on the voltage cycle, the differential variance calculation can quickly identify whether there is a voltage sag, thereby determining whether there is a voltage modulation signal; and S3, demodulating the characteristic signal by the signal identification device to obtain the current modulation signal and the voltage modulation signal respectively; and determining whether data corresponding to the current modulation signal and date corresponding to the voltage modulation signal are predetermined data, wherein if so, the characteristic signal exists; if not, no characteristic signal exists; it should be noted that in the step S2, it is only necessary to preliminarily determine whether the voltage modulation signal exists, so it is only necessary to use the differential variance calculation; to confirm whether the voltage modulation signal actually exists, further calculation is necessary, wherein Gaussian difference variance demodulation calculation is preferred, which can greatly reduce the possibility of misjudgment.

Specifically, the current modulation signal of the present invention is generally the distorted signal, but is not specifically limited, as long as it can be identified in the power frequency signal. The signal triggering device can be an independent installation module, or an accessory module on an electronic device (such as an electric energy meter), as long as the characteristic signal can be superimposed on the power frequency signal. The characteristic signal comprises current characteristic signal and voltage characteristic signal, which means that the current characteristic signal can be superimposed on the current cycle of the power frequency signal, and the voltage characteristic signal can be superimposed on the voltage cycle of the power frequency signal. The signal identification device can be an independent installation module, or an accessory module of an electronic device (such as a court terminal or court identification instrument), which can correspondingly identify the characteristic signal transmitted by the signal triggering device.

Preferably, according to the embodiment, the characteristic signal may be same or different within a court, which is not specifically limited. For the convenience of description, the characteristic signal of the embodiment is identical. 0xA5 can be selected as a feature code of a start bit of the characteristic signal, wherein preferably, 8 voltage cycles and current cycles are used for superimposing the characteristic signal. A binary bit represents whether a cycle needs to be modulated (when the signal identification device works, each binary bit represents whether a cycle is modulated), wherein 1 represents modulation is needed, and 0 represents no modulation is needed. According to properties of the voltage modulation signal (one voltage cycle can form one voltage modulation signal) and the current modulation signal (N current cycles can form one current modulation signal), the characteristic signal comprises 8 voltage modulation signals and multiple current modulation signals. According to the embodiment, four current cycles are used to form one current modulation signal. Preferably, in the embodiment, data formed by the voltage modulation signal is 10100101, and data formed by using the current modulation signal is 10. The signal triggering devices on all terminal equipment of the court can be externally set to other data, which is not specifically limited by the present invention. In this way, when the voltage modulation signal needs to be modulated, only 4 cycles need to be modulated (when the voltage modulation signal is modulated, it is modulated to 1, not 0). For the current modulation signal, the first 4 current cycles form one current modulation signal, and the last 4 current cycles form the other current modulation signal.

Preferably, in the embodiment, the step S2 comprises specific steps of:

S21. acquiring the voltage cycles to be detected and several previous continuous voltage cycles by the signal identification device; performing differential calculation on voltage sampling points near zero-crossing points of two adjacent voltage cycles, so as to obtain several differential voltage values; preferably, a differential calculation formula is: $\Delta U=U_{1i}-U_{0i}$, wherein $\Delta U$ is the differential voltage value; $U_{1i}$ is the voltage sampling point of the current voltage cycle; $U_{0i}$ is the voltage sampling point corresponding to the previous voltage cycle;

S22, performing variance calculation on the differential voltage values to obtain a voltage value variance; and S23; determining whether the voltage value variance exceeds a preset threshold by the signal identification device, wherein if so, a voltage characteristic point exists; if not, no voltage characteristic point exists.

Preferably, in the embodiment, a calculation formula of the voltage value variance is:

$$s^2 = \frac{1}{N}\sum_{i=1}^{N}[\Delta U_i - \Delta U_M]^2;$$

wherein $\Delta U_i$ (i=1, 2, ..., N) represents the differential voltage values; $\Delta U_M$ is an average value of all the differential pressure values involved in calculation; and N is a quantity of the differential pressure values.

Preferably, in the embodiment, demodulation processes of the current modulation signal and the voltage modulation signal need to be synchronized on a time axis to support each other. And decoding of the current modulation signal and the voltage modulation signal should be the same as the predetermined current signal and predetermined voltage signal respectively to determine whether there is the characteristic signal and whether the characteristic signal is accurate. Therefore, a demodulating process in the step S3 comprises steps of:

S31, evenly dividing the multiple current cycles into successive current cycle groups, and evenly dividing the multiple voltage cycles into successive voltage cycle groups; wherein each of the current cycle groups comprises continuous N current cycles, and each of the voltage cycle groups comprises continuous N voltage cycles;

S32, matching the voltage cycle groups with the current cycle groups before participating in calculation;

S33, performing Gaussian differential variance demodulation on the N voltage cycles in each of the voltage cycle groups to obtain N voltage modulation signals for synthesizing a partial voltage characteristic signal, and determining whether the partial voltage characteristic signal is a predetermined voltage signal; if so, executing step S34; if not, executing the step S2 because no characteristic signal exists;

S34, performing time domain difference matrix algorithm processing on the N current cycles in each of the current cycle groups to obtain the current modulation signal, and determining whether the current modulation signal is a predetermined current signal; if so, executing step S35; if not, executing the step S2 because no characteristic signal exists; and S35, determining whether calculations of all the voltage cycle groups are completed; if so, determining the characteristic signal exists; if not, executing the step S32. For example, the characteristic signal comprises 8 bits of the voltage modulation signals and 2 bits of the current modulation signal (both use the same number of cycles), which means 8 voltage cycles and 8 current cycles are divided into two groups. First, the first voltage cycle groups and a group of the voltage modulation signals are calculated, so as to determine whether it is the predetermined voltage signal. If so, the current modulation signal formed by the corresponding first current cycle group is calculated, so as to determine whether it is the predetermined current signal. If so, the second voltage cycle group is calculated, and then the second current cycle group is calculated, thereby completing the process. As a result, the voltage modulation signal and the current modulation signal are kept consistency on the time axis during demodulation.

Preferably, in the embodiment, due to complex on-site situations, noise in the power frequency signal keeps changing. In order to improve accuracy of voltage capture, a dynamic sliding variance method is used to perform Gaussian sliding variance calculation on a current cycle and a previous reference cycle, so as to obtain an accurate characteristic analysis result. In the step S33, the Gaussian differential variance demodulation comprises steps of:

S331, performing multiple sliding variance calculations on a voltage zero-crossing area by the signal identification device to obtain multiple sliding variance values, and selecting an optimal value according to a Gaussian distribution as a voltage value identification variance; and S332, determining whether the voltage value identification variance is larger than an identification threshold by the signal identification device; wherein if so, existence of the voltage modulation signal is confirmed; if not, no voltage modulation signal exists.

Preferably, in the embodiment, the sliding variance calculations comprise: changing an initial voltage sampling point several times in the voltage zero-crossing point area, and obtaining same numbers of voltage sampling points each time; performing differential calculation on two adjacent voltage sampling points respectively to obtain multiple voltage differential point values, and then calculating with a sliding variance calculation formula:

$$s_k = \frac{1}{K}\sum_{j=k}^{K+k}[\Delta U_j - \Delta U_{MK}]^2;$$

wherein K is a quantity of the voltage sampling points, which means a quantity of the voltage differential point values; $\Delta U_j$ (j=k, k+1, ..., K+k) represents the voltage differential point values; $\Delta U_{MK}$ is an average value of the K voltage differential point values; and k is a position of the initial voltage sampling point after sliding.

Preferably, in the embodiment, the step S34 comprises specific steps of:

S341, determining the N current cycles and a reference current cycle participating in calculation;

S342, performing the time domain difference matrix algorithm processing on two current half-waves of each of the current cycles and two reference current half-waves of the reference current cycle, respectively, to obtain a differential half-wave matrix, and then obtaining the characteristic peak value;

S343, comparing the characteristic peak value with modulation intensity of the current cycles; if an absolute value of the characteristic peak value is greater than or equal to twice the modulation intensity, determining the current modulation signal exists, and executing step S344; if not, executing the step S2 because no characteristic signal exists; and S344, determining whether the current modulation signal is the predetermined current signal, if so, executing the step S35; if not, executing the step S2.

Specifically, the time domain difference matrix algorithm is as follows: using the multiple current cycles of the current characteristic signal to calculate with the reference current cycle respectively; performing half-wave differential calculation on two current half-waves of each of the current cycles and two reference current half-waves of the reference current cycle, respectively, to obtain a differential half-wave matrix. Specifically, the current cycle and the reference current cycle are equally divided into two parts, wherein the current cycle is divided into a positive current half-wave and a negative current half-wave, while the reference current cycle is divided into a positive reference current half-wave and a negative reference current half-wave. In general, the reference current cycle is selected as the current cycle corresponding to a previous voltage cycle in which the voltage modulation signal is detected.

Preferably, in the embodiment, the time domain difference matrix algorithm formula is:

$$\Delta I_n = \sum_{a=1}^{A}(i_{na} - i_{f(n)a});$$

wherein n=1, 2, . . . , 2N is a serial number of differential half-waves; A is a total number of current sampling points on one of the current half-waves; $i_{na}$ is a current sampling point of the current half-waves participating in calculation; $i_{f(n)a}$ is a current sampling point of the reference current half-waves; and f(n) is a serial number of the reference current half-waves; when n is odd, it represents positive, and when n is even, it represents negative; the time domain difference matrix algorithm is used to obtain the differential half-wave matrix;

$$R = \sum_{n=1}^{2N}(\Delta I_n * M_n);$$

wherein R is the characteristic peak value; $\Delta I_n$ represents a number n differential half-wave; $M_n$ is a matrix variable of the number n differential half-wave.

In practice, it is assumed that there are two current modulation signals in the characteristic signal, and each of the current modulation signals is formed by 4 current cycles. Different from the voltage modulation signal that only superimposes at a positive zero-crossing area of the voltage cycle, superposition of the instantaneous pulses is modulated in the positive zero-crossing area and the negative zero-crossing area of one current cycle respectively. 8 current half-waves of the 4 current cycles are numbered as 1-8, wherein odd numbers represent positive current half-waves, and even numbers represent negative current half-waves. In practice, superposition of the instantaneous pulse has three forms, 1 signal instantaneous pulse, 0 signal instantaneous pulse and no signal instantaneous pulse, wherein a modulation signal "1" is added to current half-wave zero-crossing points 1, 4, 5, and 6; and a modulation signal "0" is added to current half-wave zero-crossing points 2, 3, 7, and 8. The time domain difference matrix algorithm are performed on the 8 half-wave current signals and the positive current half-wave and the negative current half-wave of the reference current cycle, so as to obtain the characteristic peak value R. When R=0, it means that there is no current modulation signal; when R>=2c, it means that the current modulation signal is "1"; and when R<=−2c, it means that the current modulation signal is "0", wherein c is the modulation intensity of each current cycle.

The method of the present invention is also used in a file management method for household line relationships in a court, and the file management method adopts the method for extracting the characteristic signal from the power frequency signal as mentioned above, and then performing file management on the household line relationships. It should be noted that the performed household line relationship file management adopts a common method in the field, which will not be specifically limited in the present invention. For example, the court terminal has the signal identification device, and the electric energy meter in the court has the signal triggering device, so as to determine whether there is corresponding file information according to a received characteristic signal, thus performing management.

It can be understood that for those of ordinary skill in the art, equivalent replacements or changes can be made according to the technical solutions of the present invention and the inventive concept thereof, and all these changes or replacements should fall in the protection scope defined by the appended claims of the present invention.

What is claimed is:

1. A method for extracting a characteristic signal from a power frequency signal, comprising steps of:
    S1, detecting a voltage half-wave zero-crossing area in a single voltage cycle in the power frequency signal by a signal triggering device; superimposing a voltage modulation signal on the voltage half-wave zero-crossing area, and superimposing an instantaneous pulse on a current cycle in the power frequency signal corresponding to the voltage half-wave zero-crossing area to form a current modulation signal; generating the characteristic signal with multiple continuous current cycles and multiple voltage cycles;
    S2, demodulating in real time whether there is the voltage modulation signal in the power frequency signal by a signal identification device, if so, executing step S3; if not, performing no operation; and
    S3, demodulating the characteristic signal by the signal identification device to obtain the current modulation signal and the voltage modulation signal respectively; and determining whether data corresponding to the current modulation signal and date corresponding to the voltage modulation signal are predetermined data, wherein if so, the characteristic signal exists; if not, no characteristic signal exists.

2. The method, as recited in claim 1, wherein each of the multiple voltage cycles forms the voltage modulation signal; N instantaneous pulses form the current modulation signal.

3. The method, as recited in claim 2, wherein a demodulating process in the step S3 comprises steps of:
- S31, evenly dividing the multiple current cycles into successive current cycle groups, and evenly dividing the multiple voltage cycles into successive voltage cycle groups; wherein each of the current cycle groups comprises continuous N current cycles, and each of the voltage cycle groups comprises continuous N voltage cycles;
- S32, matching the voltage cycle groups with the current cycle groups before participating in calculation;
- S33, performing Gaussian differential variance demodulation on the N voltage cycles in each of the voltage cycle groups to obtain N voltage modulation signals for synthesizing a partial voltage characteristic signal, and determining whether the partial voltage characteristic signal is a predetermined voltage signal; if so, executing step S34; if not, executing the step S2 because no characteristic signal exists;
- S34, performing time domain difference matrix algorithm processing on the N current cycles in each of the current cycle groups to obtain a characteristic peak value, so as to obtain the current modulation signal, and determining whether the current modulation signal is a predetermined current signal; if so, executing step S35; if not, executing the step S2 because no characteristic signal exists; and
- S35, determining whether calculations of all the voltage cycle groups are completed; if so, determining the characteristic signal exists; if not, executing the step S32.

4. The method, as recited in claim 3, wherein in the step S33, the Gaussian differential variance demodulation comprises steps of:
- S331, performing multiple sliding variance calculations on a voltage zero-crossing area by the signal identification device to obtain multiple sliding variance values, and selecting an optimal value according to a Gaussian distribution as a voltage value identification variance; and
- S332, determining whether the voltage value identification variance is larger than an identification threshold by the signal identification device; wherein if so, existence of the voltage modulation signal is confirmed; if not, no voltage modulation signal exists.

5. The method, as recited in claim 4, wherein the sliding variance calculations comprise: changing an initial voltage sampling point several times in the voltage zero-crossing point area, and obtaining same numbers of voltage sampling points each time; performing differential calculation on two adjacent voltage sampling points respectively to obtain multiple voltage differential point values, and then calculating with a sliding variance calculation formula:

$$s_k = \frac{1}{K}\sum_{j=k}^{K+k}[\Delta U_j - \Delta U_{MK}]^2;$$

wherein K is a quantity of the voltage sampling points, which means a quantity of the voltage differential point values; $\Delta U_j$ (j=k, k+1, ..., K+k) represents the voltage differential point values; $\Delta U_{MK}$ is an average value of the K voltage differential point values; and k is a position of the initial voltage sampling point after sliding.

6. The method, as recited in claim 3, wherein the step S34 comprises specific steps of:
- S341, determining the N current cycles and a reference current cycle participating in calculation;
- S342, performing the time domain difference matrix algorithm processing on two current half-waves of each of the current cycles and two reference current half-waves of the reference current cycle, respectively, to obtain a differential half-wave matrix, and then obtaining the characteristic peak value;
- S343, comparing the characteristic peak value with modulation intensity of the current cycles; if an absolute value of the characteristic peak value is greater than or equal to twice the modulation intensity, determining the current modulation signal exists, and executing step S344; if not, executing the step S2 because no characteristic signal exists; and
- S344, determining whether the current modulation signal is the predetermined current signal, if so, executing the step S35; if not, executing the step S2.

7. The method, as recited in claim 6, wherein the time domain difference matrix algorithm formula is:

$$\Delta I_n = \sum_{a=1}^{A}(i_{na} - i_{f(n)a});$$

wherein n=1, 2, ..., 2N is a serial number of differential half-waves; A is a total number of current sampling points on one of the current half-waves; $i_{na}$ is a current sampling point of the current half-waves participating in calculation; $i_{f(n)a}$ is a current sampling point of the reference current half-waves; and f(n) is a serial number of the reference current half-waves;

$$R = \sum_{n=1}^{2N}(\Delta I_n * M_n);$$

wherein R is the characteristic peak value; $\Delta I_n$ represents a number n differential half-wave; $M_n$ is a matrix variable of the number n differential half-wave.

8. The method, as recited in claim 1, wherein the step S2 comprises specific steps of:
- S21, acquiring the voltage cycles to be detected and several previous continuous voltage cycles by the signal identification device; performing differential calculation on voltage sampling points near zero-crossing points of two adjacent voltage cycles, so as to obtain several differential voltage values;
- S22, performing variance calculation on the differential voltage values to obtain a voltage value variance; and
- S23; determining whether the voltage value variance exceeds a preset threshold by the signal identification device, wherein if so, a voltage characteristic point exists; if not, no voltage characteristic point exists.

9. A system for extracting a characteristic signal from a power frequency signal, comprising: a signal identification device and multiple signal triggering devices; wherein the system executes the method for extracting the characteristic signal from the power frequency signal as recited in claim 1.

10. A file management method for household line relationships in a court, comprising: adopting the method for extracting the characteristic signal from the power frequency signal as recited in claim 1, and then performing file management on the household line relationships.

\* \* \* \* \*